US012597471B2

(12) United States Patent
Habhab et al.

(10) Patent No.: US 12,597,471 B2
(45) Date of Patent: Apr. 7, 2026

(54) NON-VOLATILE MEMORY AND CORRESPONDING MANUFACTURING METHOD

(71) Applicant: STMicroelectronics International N.V., Geneva (CH)

(72) Inventors: Radouane Habhab, Marseilles (FR); Vincenzo Della Marca, Marseilles (FR); Nadia Miridi ép Seroschtanoff, Auriol (FR); Pascal Masson, Valbonne (FR); Franck Melul, Aubagne (FR); Madjid Akbal, Trets (FR)

( * ) Notice: Subject to any disclaimer, the term of this patent is extended or adjusted under 35 U.S.C. 154(b) by 9 days.

(21) Appl. No.: 18/753,094

(22) Filed: Jun. 25, 2024

(65) Prior Publication Data

US 2025/0006267 A1     Jan. 2, 2025

(30) Foreign Application Priority Data

Jun. 30, 2023     (FR) ........................................ 2306973

(51) Int. Cl.
*G11C 16/10*          (2006.01)
*H10B 43/27*          (2023.01)
*H10D 30/69*          (2025.01)

(52) U.S. Cl.
CPC ............. *G11C 16/10* (2013.01); *H10B 43/27* (2023.02); *H10D 30/696* (2025.01); *H10D 30/699* (2025.01)

(58) Field of Classification Search
CPC .................................................... G11C 16/10
See application file for complete search history.

(56) References Cited

U.S. PATENT DOCUMENTS

| | | | |
|---|---|---|---|
| 5,424,569 A | 6/1995 | Prall | |
| 7,151,292 B1 | 12/2006 | Wong | |
| 7,303,964 B2 | 12/2007 | Shiraiwa | |
| 7,816,728 B2 | 10/2010 | Ho | |
| 8,008,713 B2 | 8/2011 | Dobuzinsky | |
| 8,513,576 B2 * | 8/2013 | Kim ..................... | H10N 70/826 |
| | | | 219/121.48 |
| 2005/0253189 A1 | 11/2005 | Cho | |
| 2013/0228846 A1 | 9/2013 | La Rosa et al. | |
| 2019/0341390 A1 | 11/2019 | Hubert | |

OTHER PUBLICATIONS

Cao, Min et al., "Boron Diffusion and Penetration in Ultrathin Oxide with Poly-Si Gate," IEEE Electron Device Letters, vol. 19, No. 8, Aug. 1998, 3 pages.
Mathiot, D. et al., "Boron diffusion through thin gate oxides: Influence of nitridation and effect on the Si/SiO2 interface electrical characteristics," Journal of Applied Physics 73 (12), Jun. 15, 1993, 7 pages.
Wong, C.Y. et al., "Ambient and dopant effects on boron diffusion in oxides," Applied Physics Letters, 48 (24), Jun. 16, 1986, 4 pages.

* cited by examiner

*Primary Examiner* — Jason Lappas
(74) *Attorney, Agent, or Firm* — Slater Matsil, LLP

(57)     ABSTRACT

The non-volatile memory device includes memory cells including a control gate vertically buried in a semiconductor substrate doped with a first type of dopant and a dielectric interface able to trap electrical charges covering sides of the control gate facing the semiconductor substrate. The device furthermore includes a vertical implanted region of a second type of dopant opposite to the first type located along the sides of the control gate in the semiconductor substrate.

20 Claims, 15 Drawing Sheets

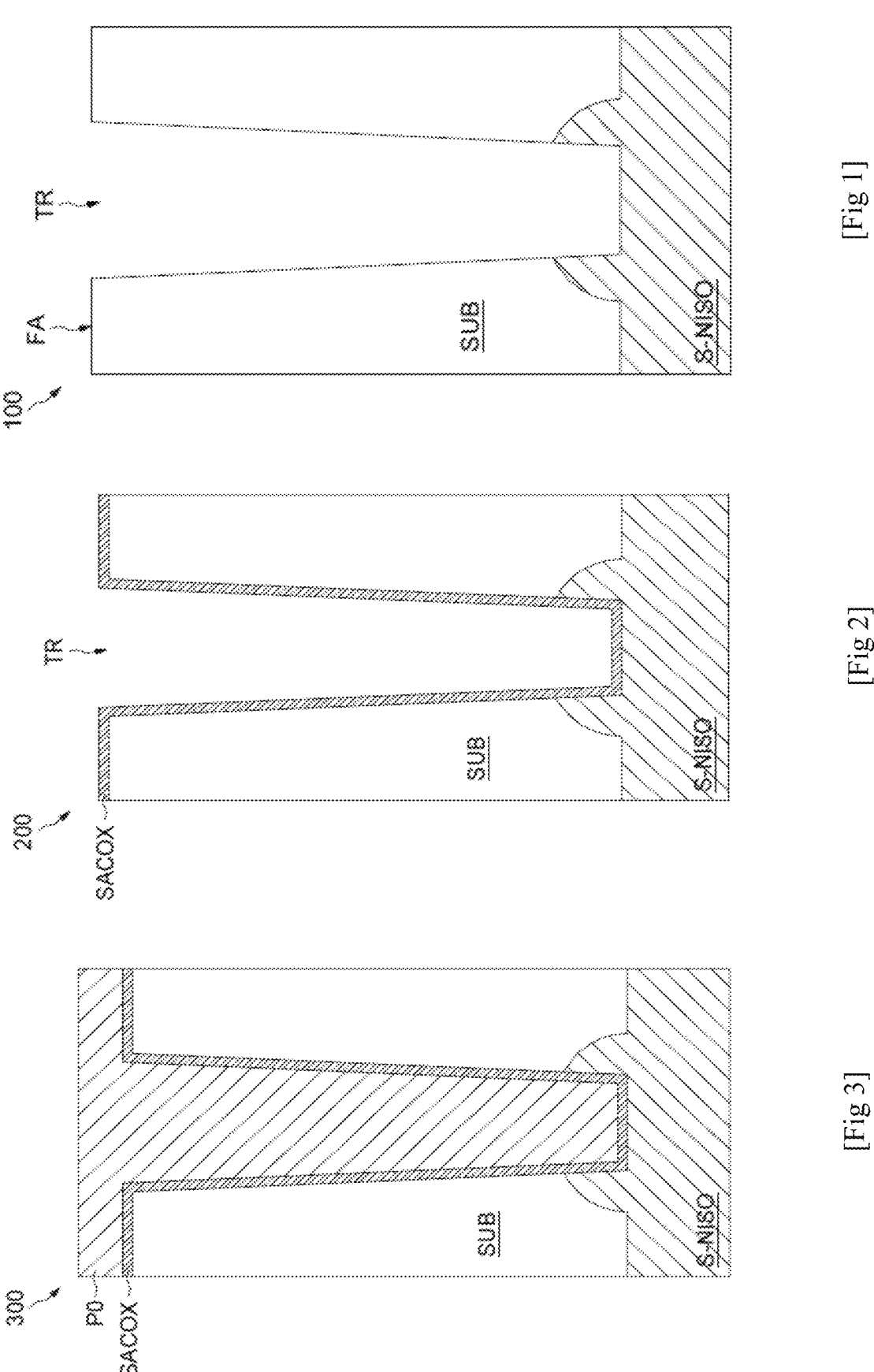
[Fig 1]
[Fig 2]
[Fig 3]

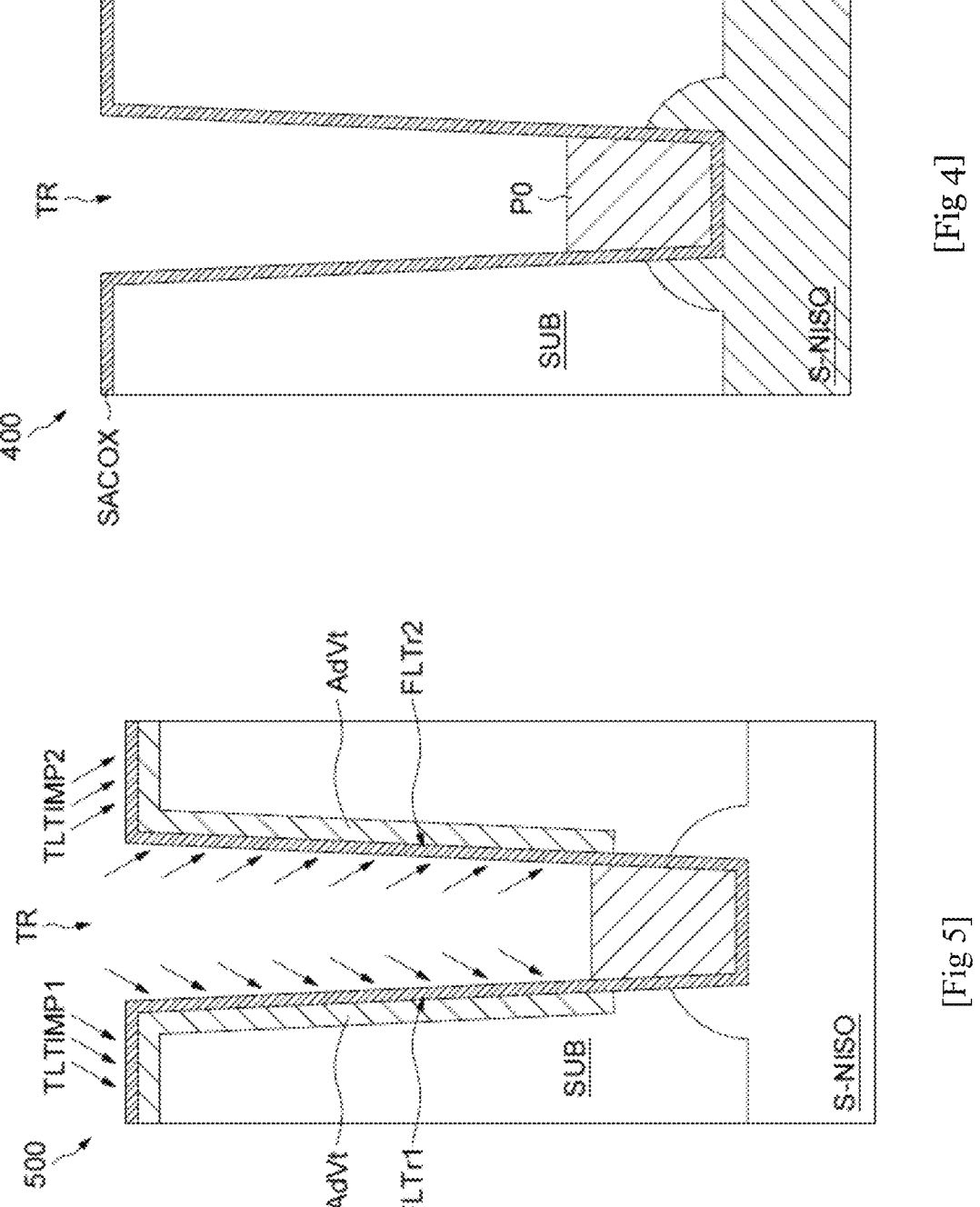
[Fig 4]
[Fig 5]

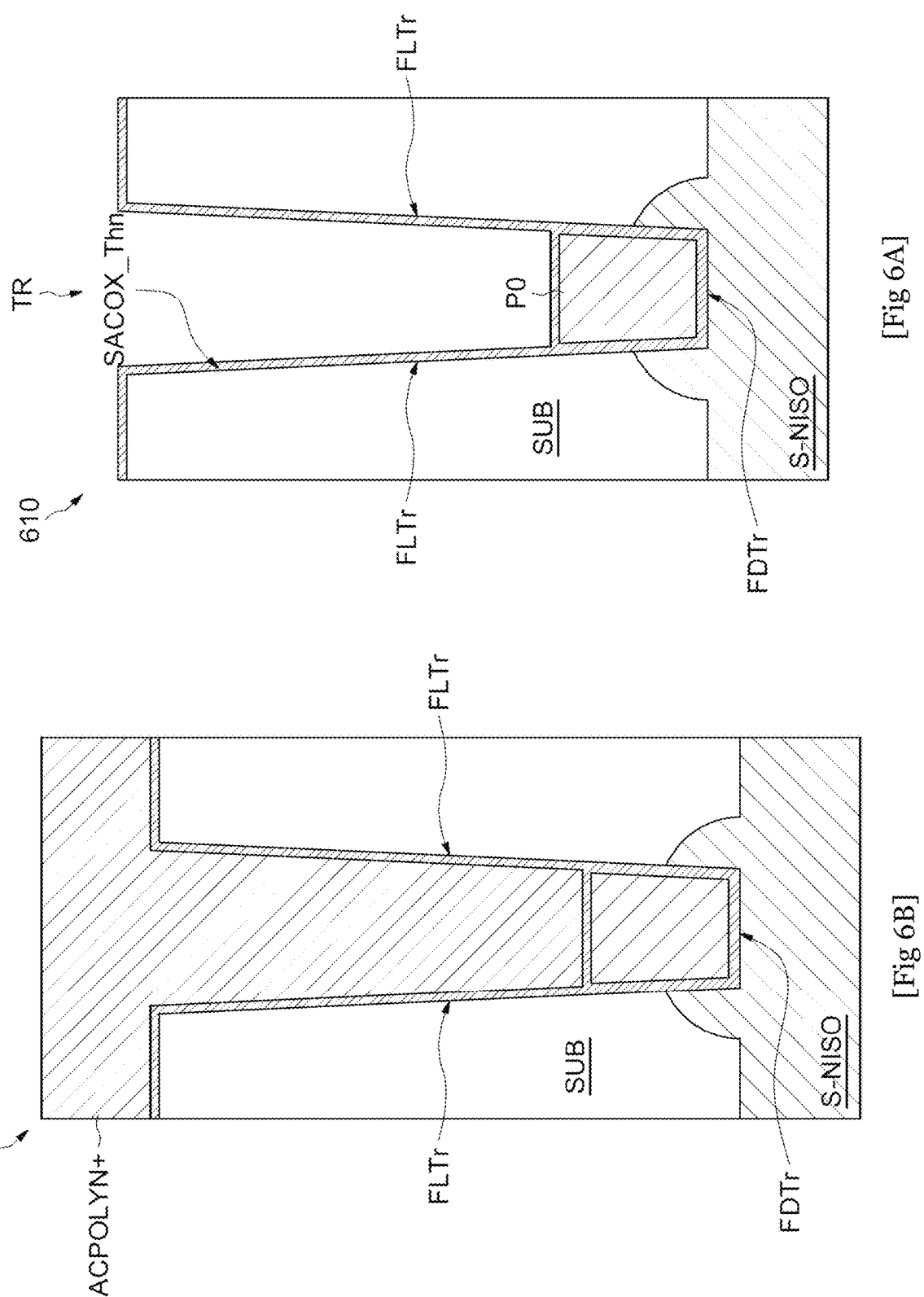
[Fig 6A]
[Fig 6B]

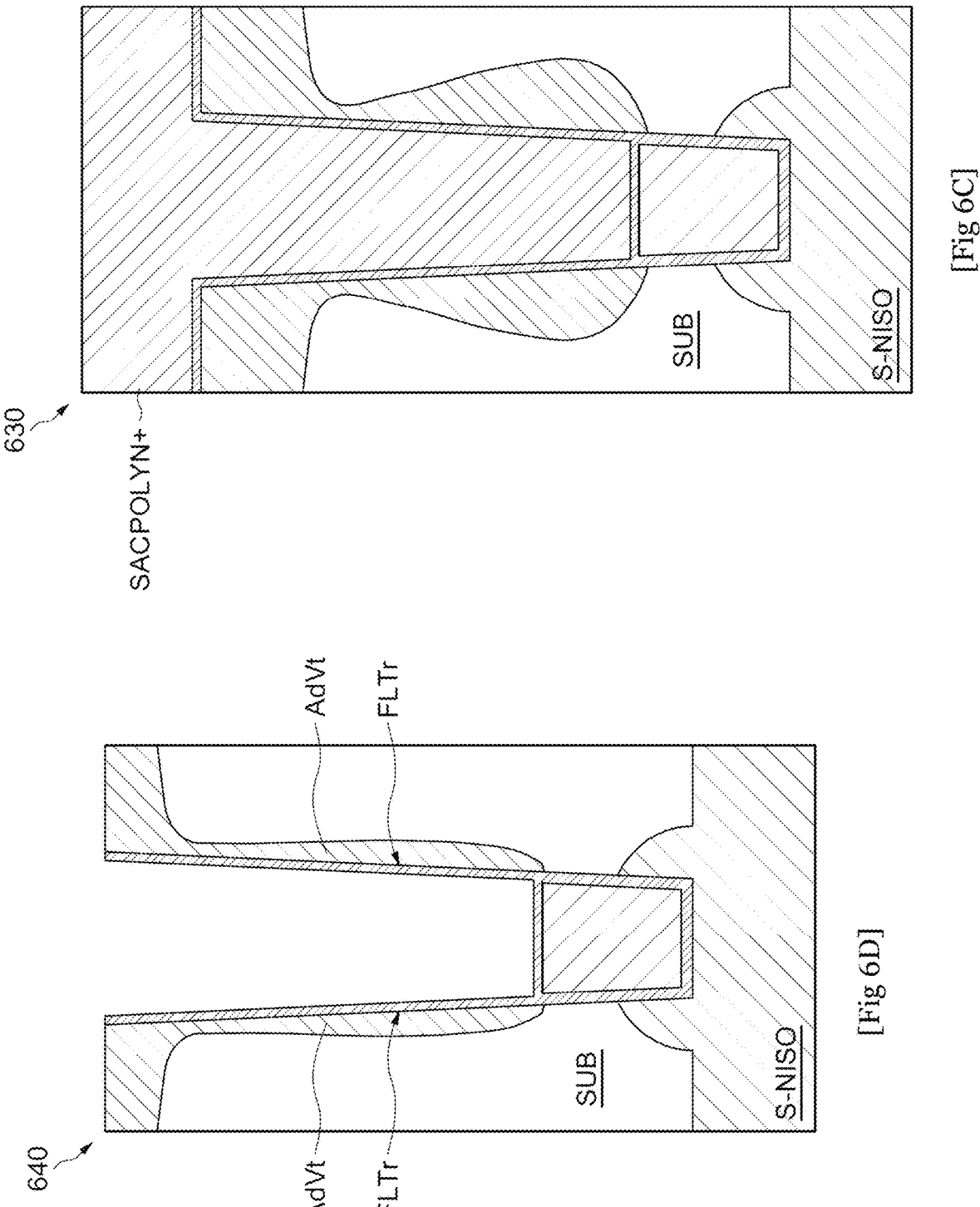
[Fig 6C]
[Fig 6D]

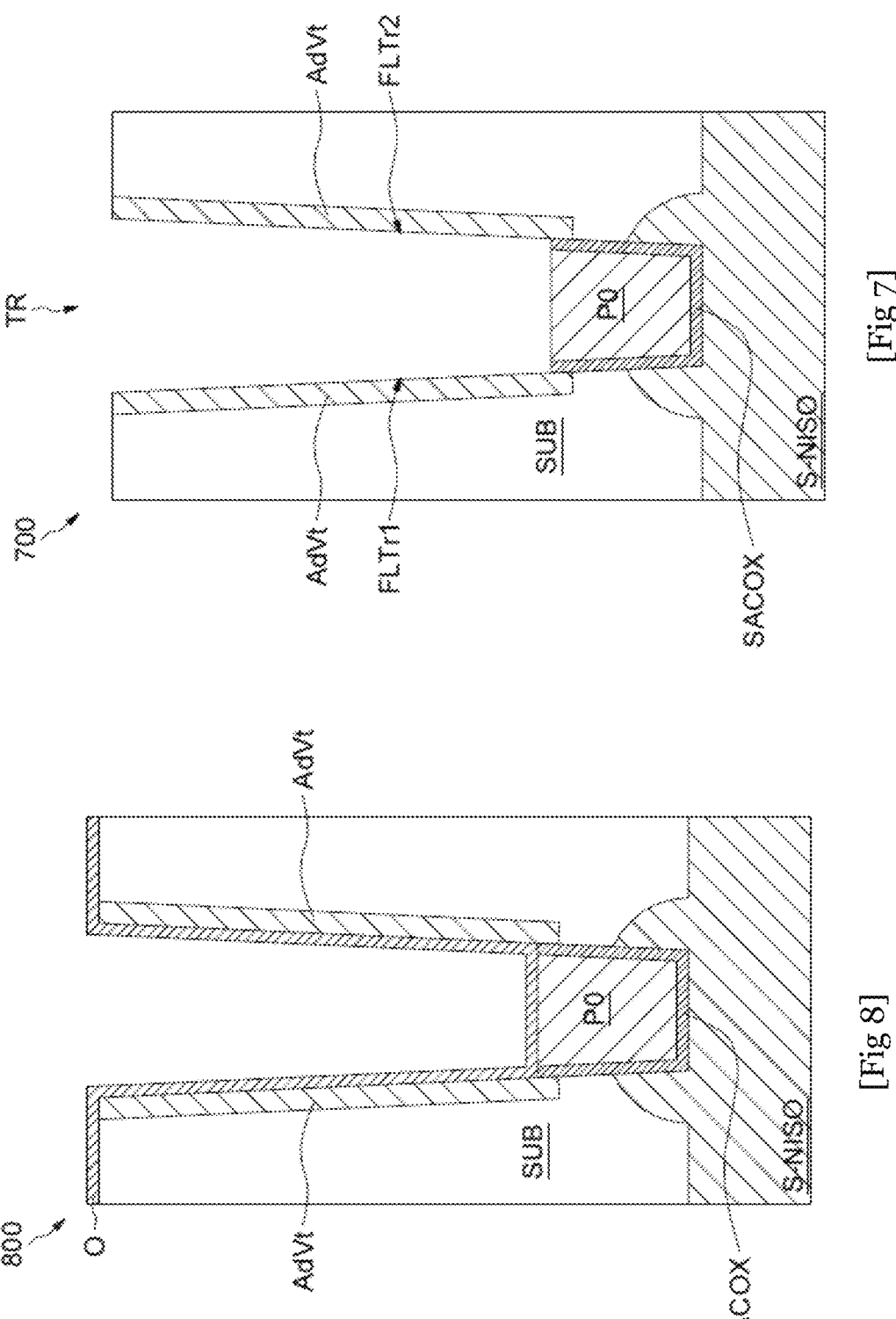
[Fig 7]
[Fig 8]

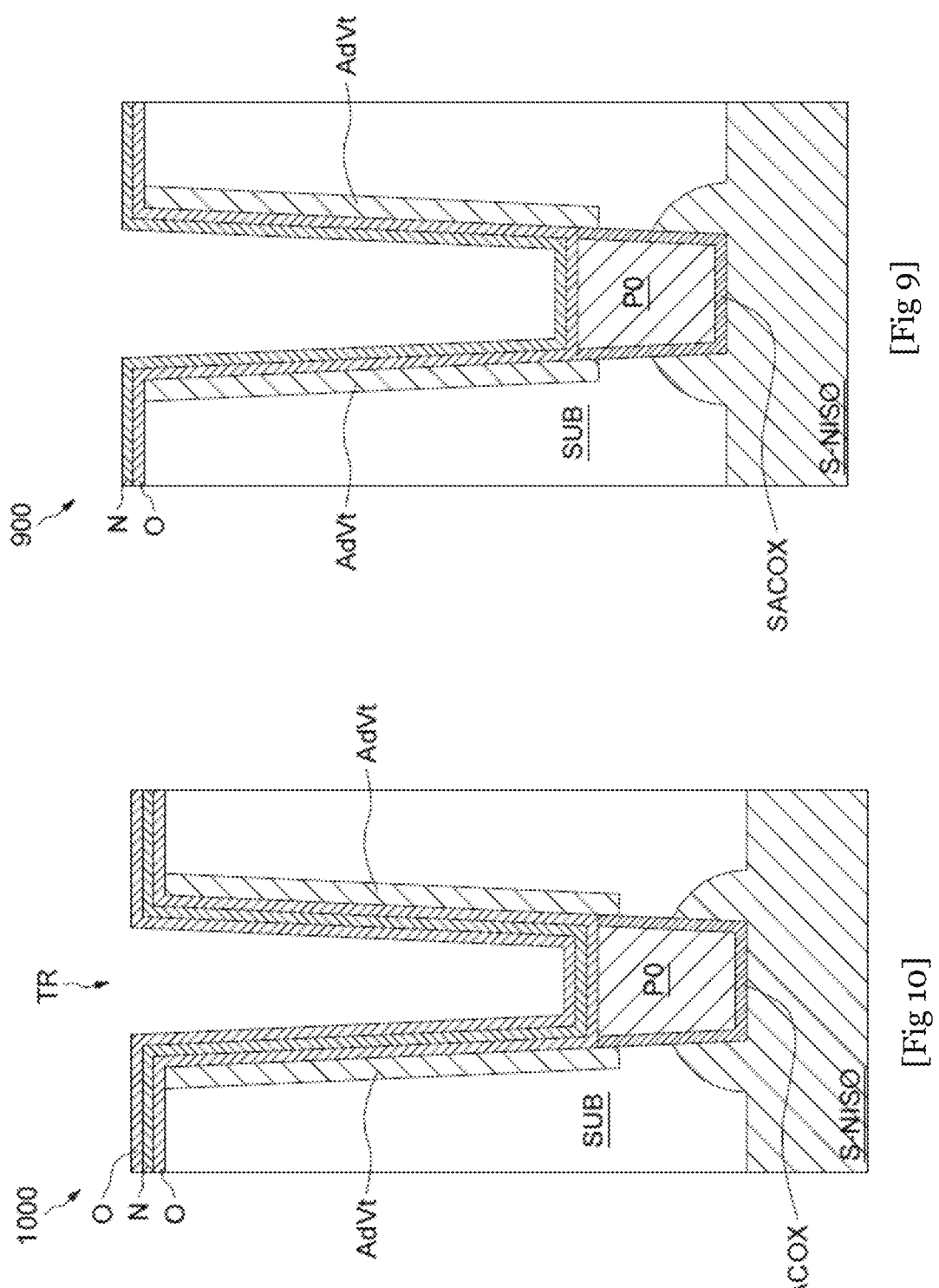
[Fig 9]
[Fig 10]

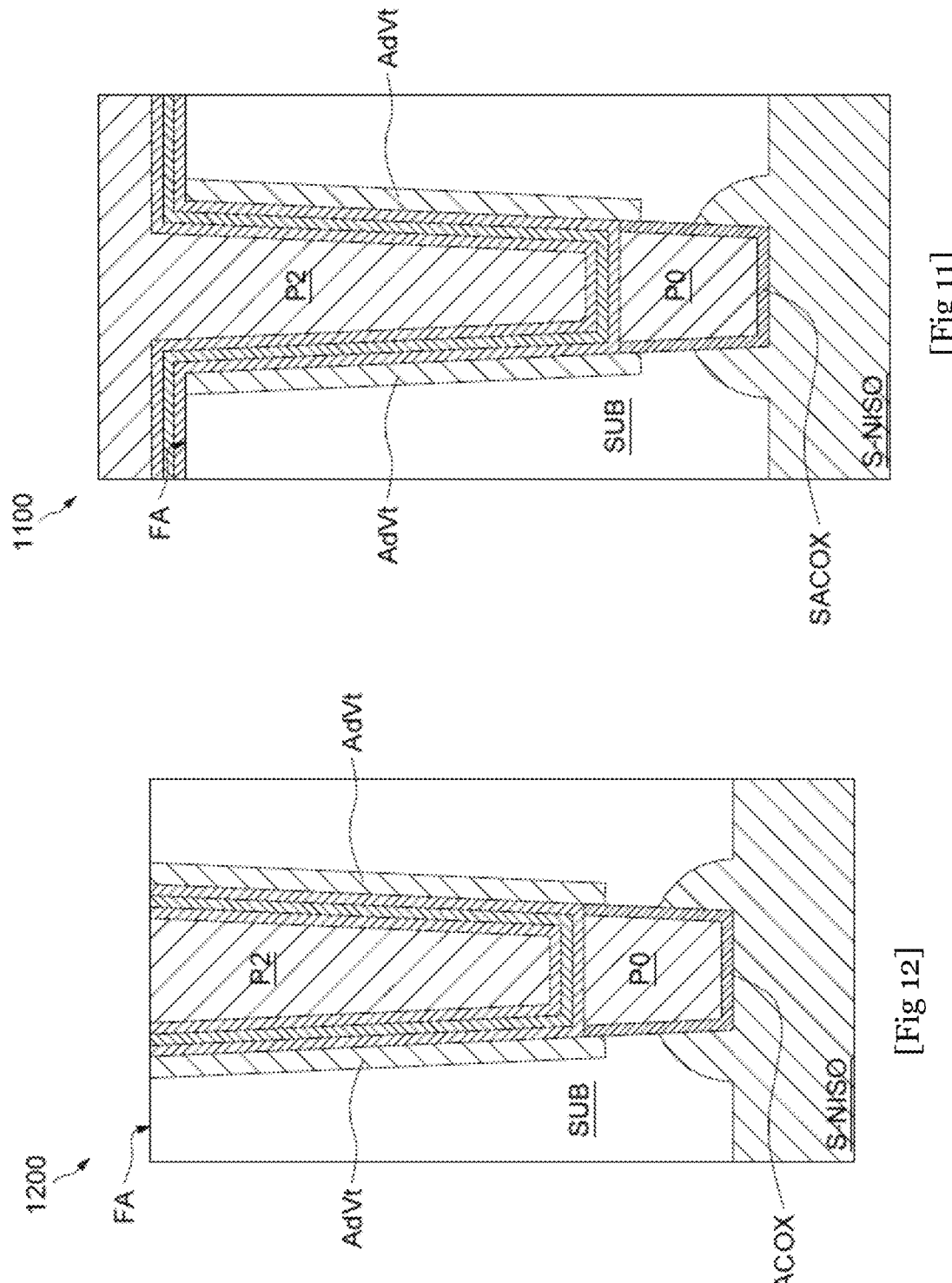
[Fig 11]
[Fig 12]

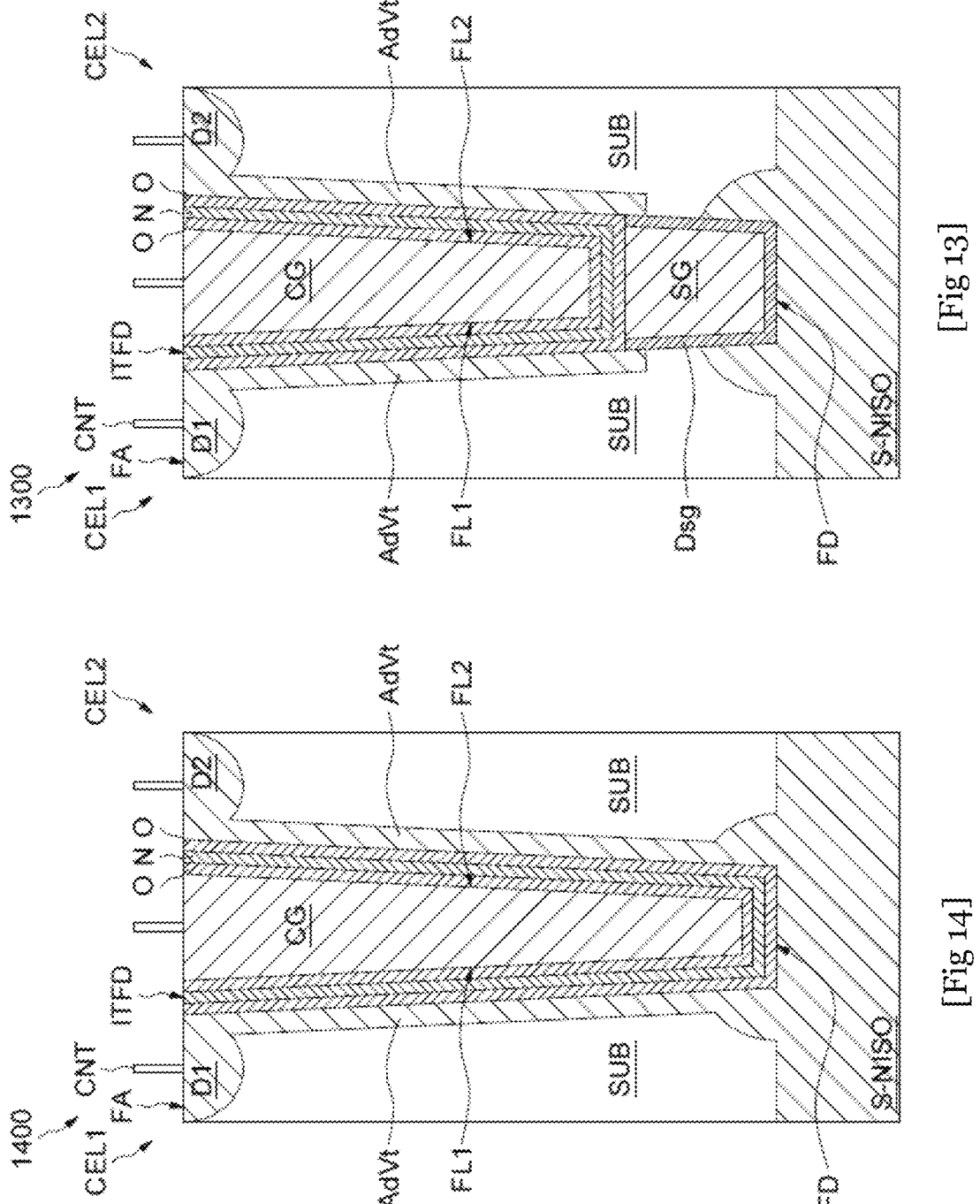
[Fig 13]
[Fig 14]

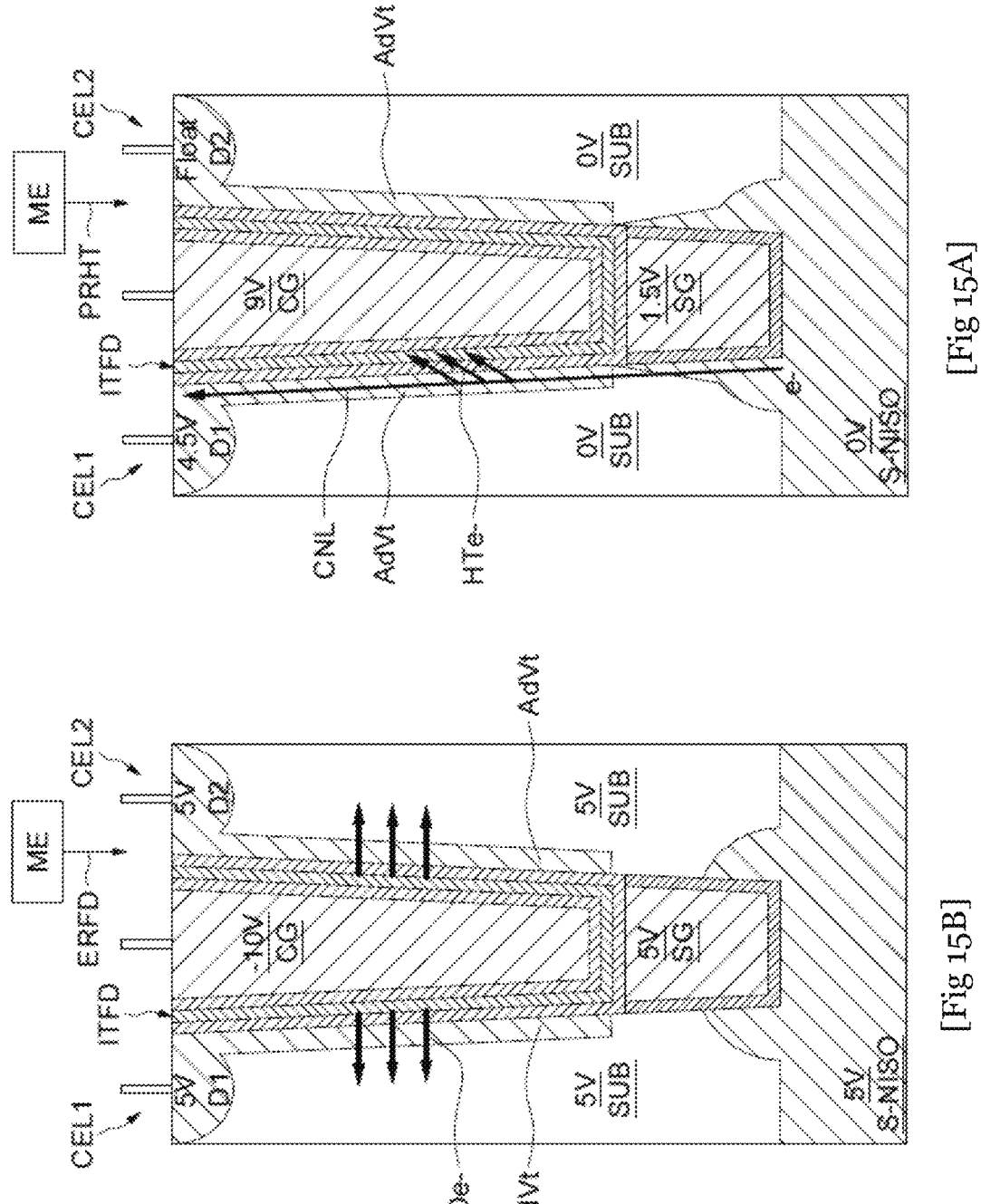
[Fig 15A]
[Fig 15B]

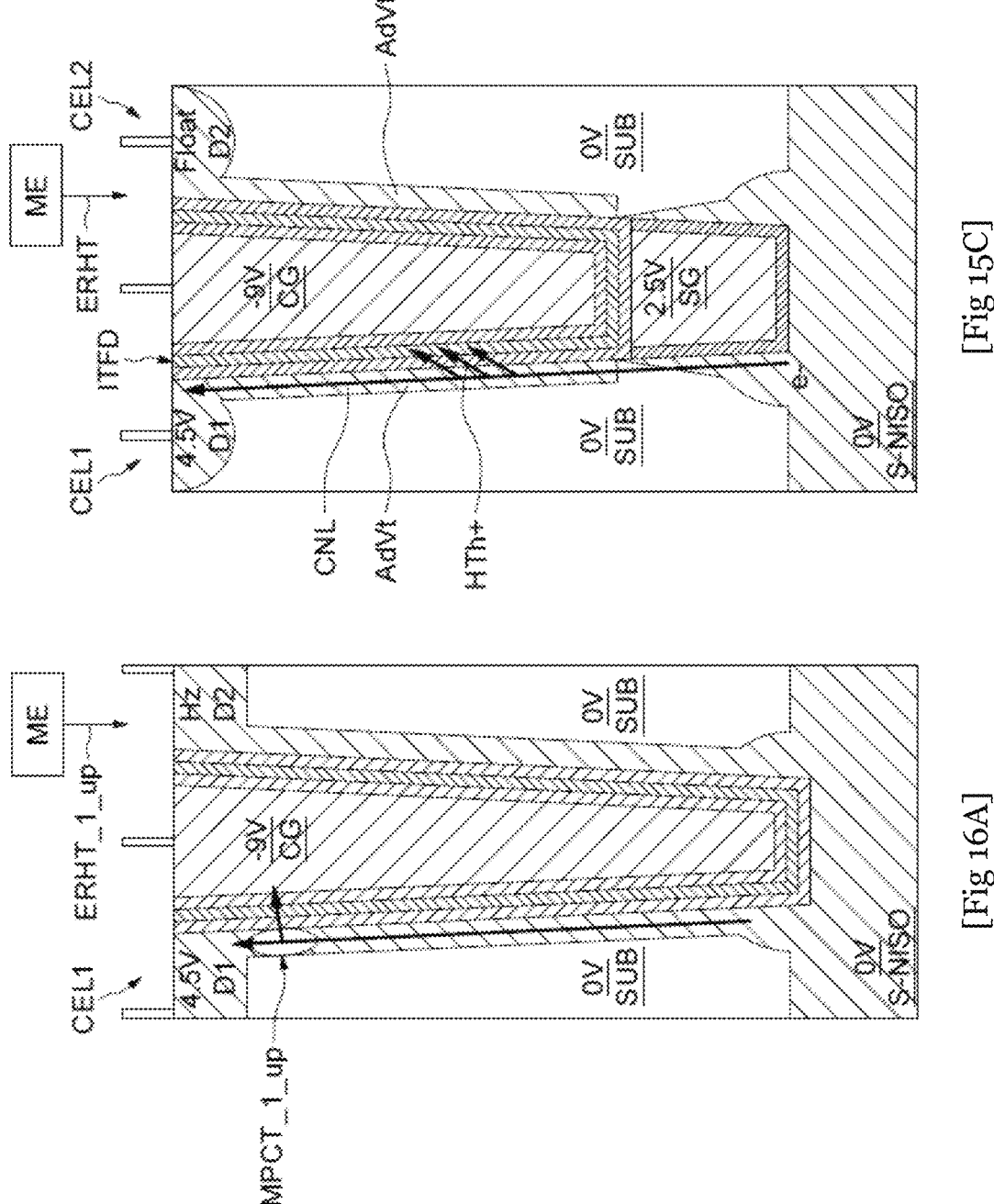
[Fig 15C]
[Fig 16A]

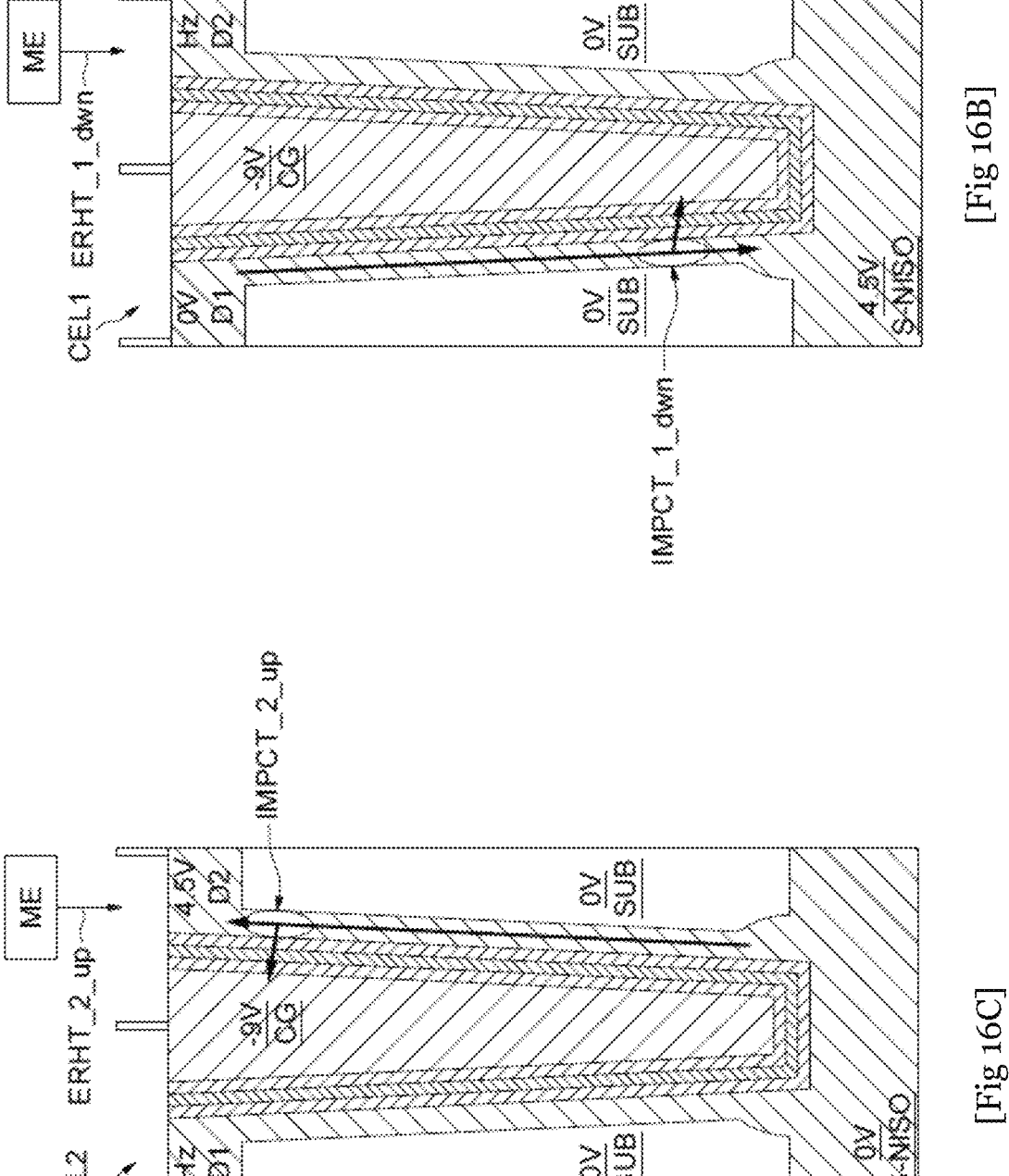
[Fig 16B]
[Fig 16C]

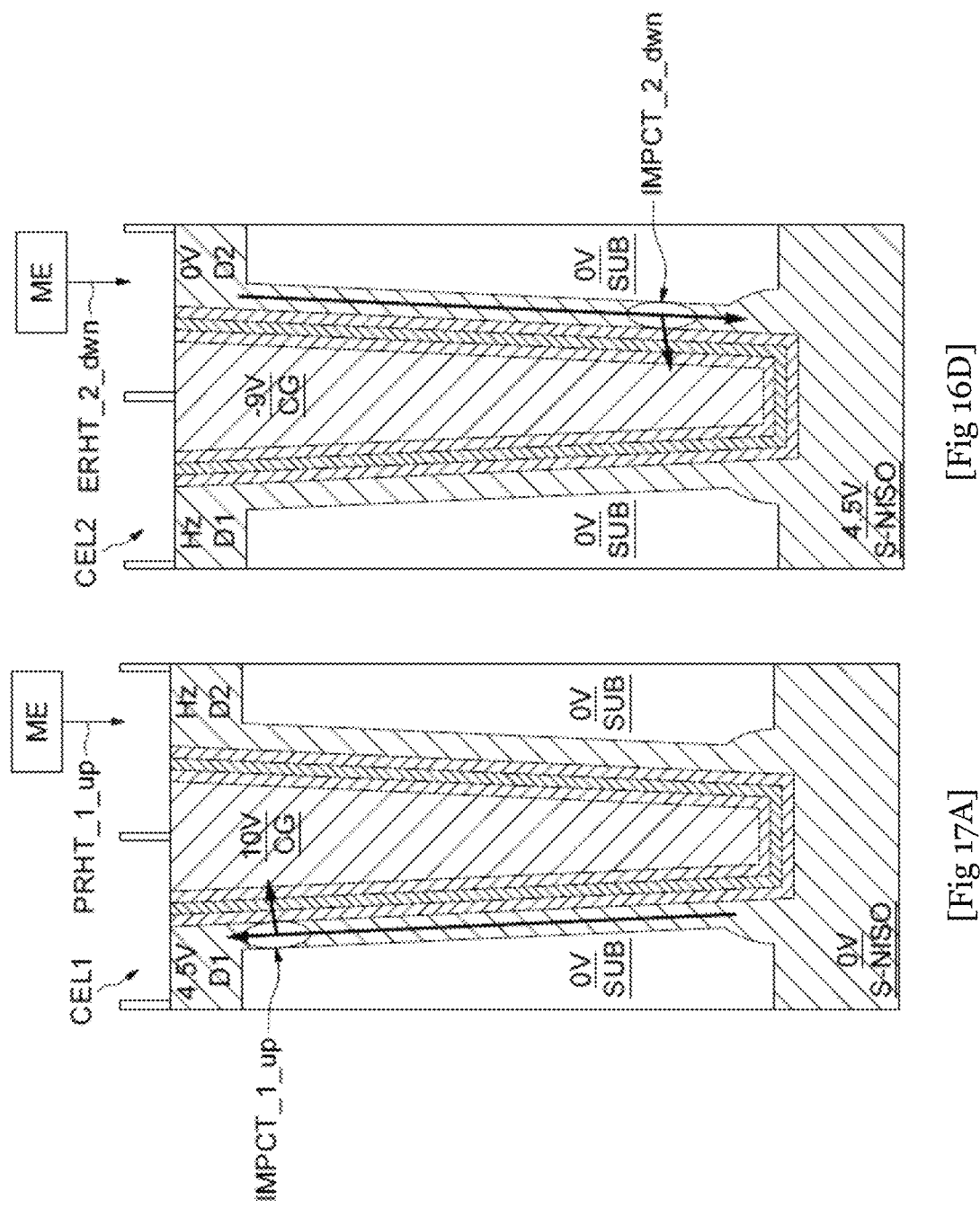
[Fig 16D]
[Fig 17A]

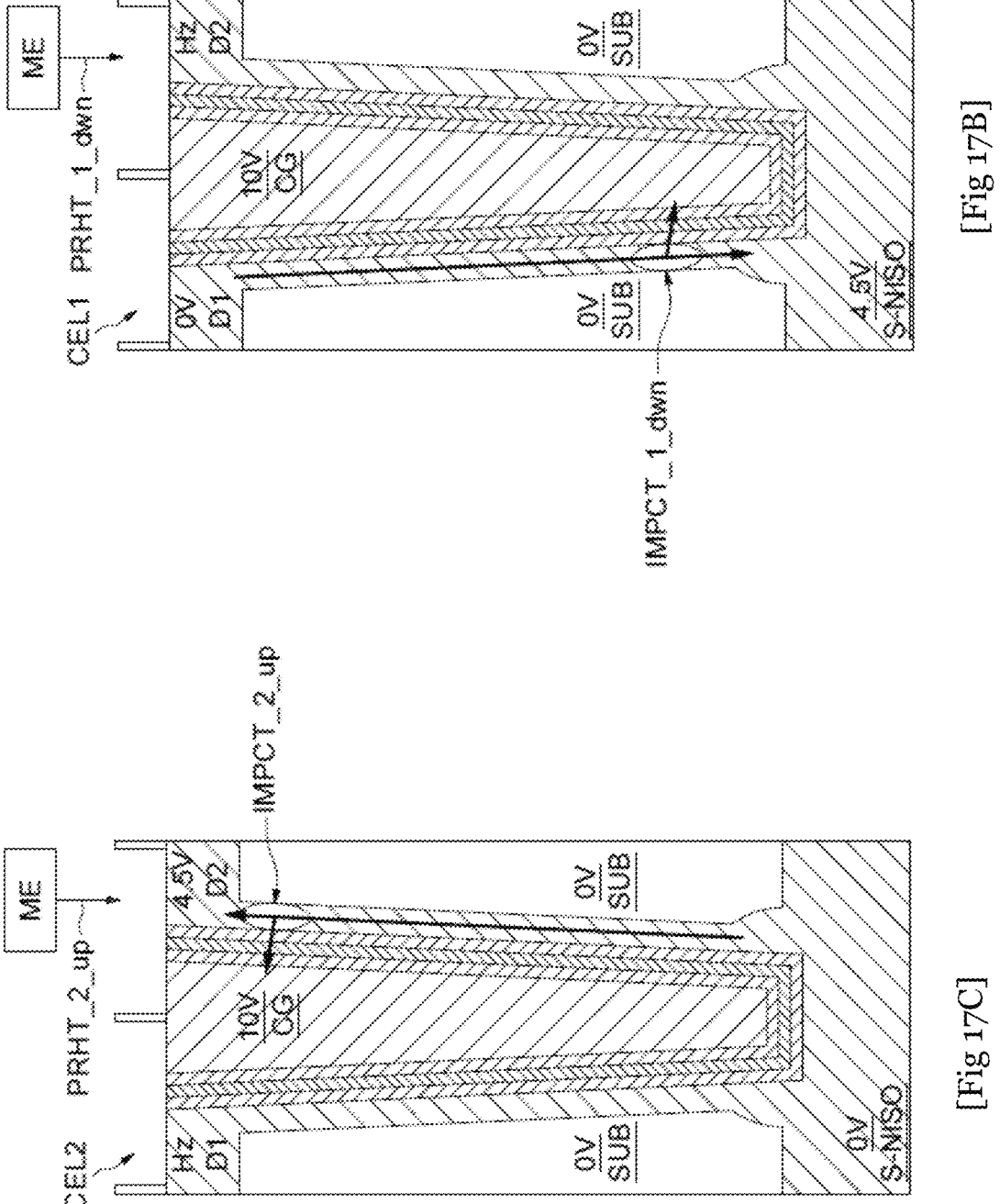
[Fig 17B]
[Fig 17C]

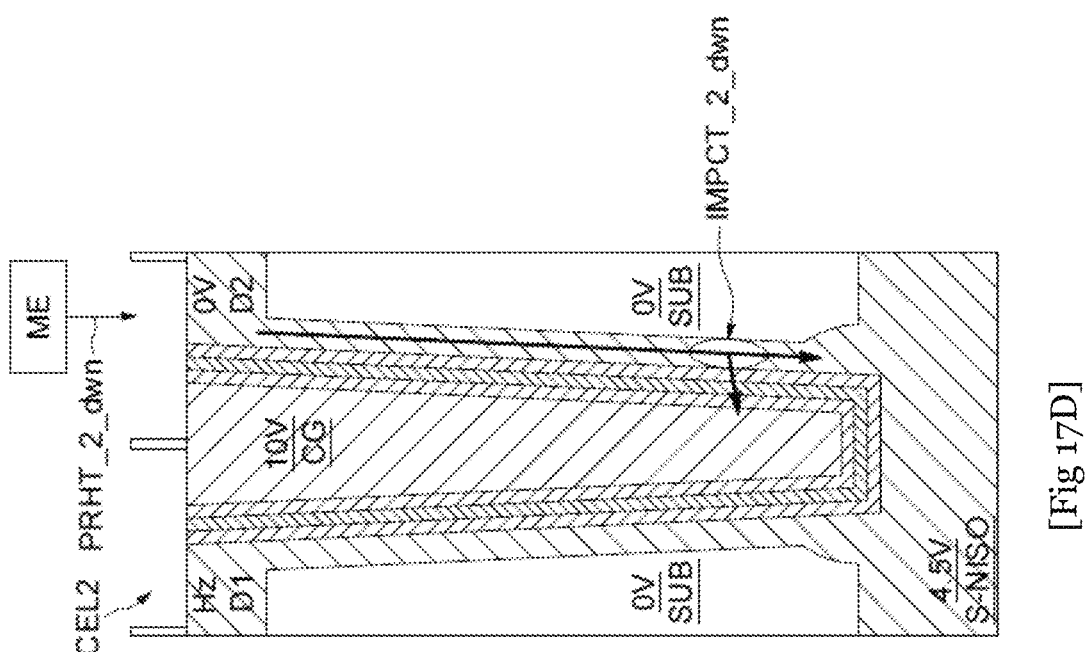
[Fig 17D]

RD_1_dwn
| Read | D1 | D2 | S | CG | SUB |
|------|-----|-----|------|-------|-----|
| Selected cell | 0.7V | Hz | GND | Sweep | GND |
| WL Disturb | Hz | Hz | GND | Sweep | GND |
| BL Disturb | 0.7V | Hz | GND | GND | GND |
| Others Disturb | Hz | Hz | GND | GND | GND |
RD_1_up
| Read | D1 | D2 | S | CG | SUB |
|------|------|-----|------|-------|-----|
| Selected cell | GND | Hz | 0.7V | Sweep | GND |
| WL Disturb | Hz | Hz | 0.7V | Sweep | GND |
| BL Disturb | Hz | Hz | 0.7V | GND | GND |
| Others Disturb | Hz | Hz | 0.7V | GND | GND |
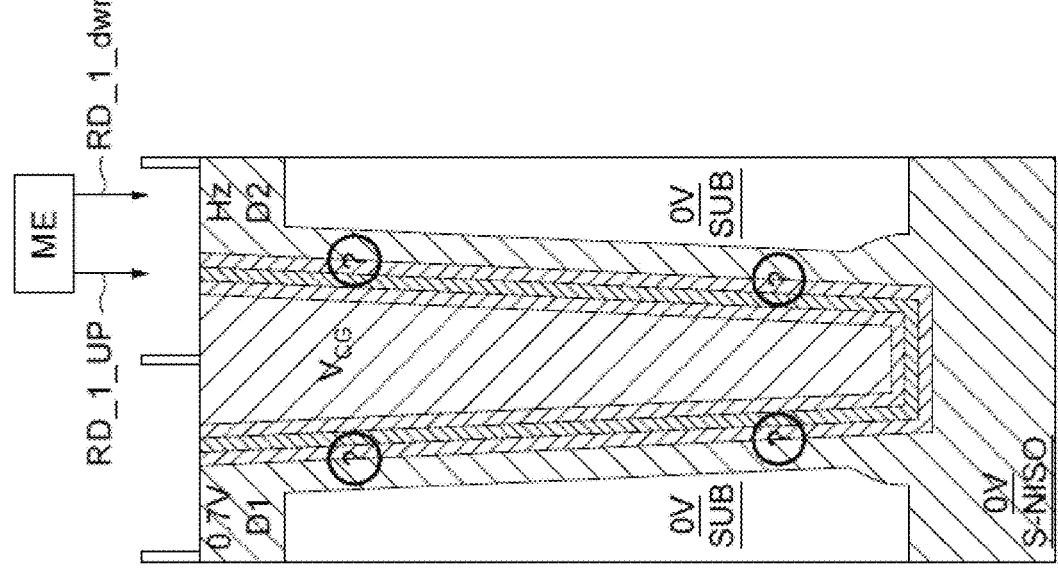
[Fig 18]

NON-VOLATILE MEMORY AND CORRESPONDING MANUFACTURING METHOD

CROSS-REFERENCE TO RELATED APPLICATIONS

This application claims priority to French Application No. 2306973, filed on Jun. 30, 2023, which application is hereby incorporated herein by reference.

TECHNICAL FIELD

Embodiments and implementations relate to integrated circuits, in particular integrated circuits including a non-volatile memory device such as a so-called charge trapping memory.

BACKGROUND

Conventional non-volatile memories are typically based on the use of transistors including a conductive floating gate region for storing an electrical charge in a non-volatile manner in order to code stored data.

In charge trapping memories, the electrical charges are stored in "charge traps" of a dielectric interface. For example, the dielectric charge trapping interface may include a layer of silicon nitride that can be framed ("in a sandwich") on either side by layers of silicon oxide, in which case technology of the "SONOS" type (standing for "Silicon Oxide Nitride Oxide Silicon") can be spoken of. Other charge trapping technologies exist, such as silicon-rich (usually "Si-Rich" in English) dielectrics, or so-called silicon "nanocrystal" technologies.

Typically, conventional charge trapping memories include a conventional planar transistor structure wherein the dielectric gate layer is composed of the dielectric charge trapping interface. Consequently, conventional charge trapping memory technologies do not have a great advantage with regard to surface footprint compared with a floating gate transistor technology.

Moreover, conventional charge trapping memories may allow programmings (arbitrarily, writing of a "0" or respectively of a "1") with a granularity of one bit, but typically require deletions (arbitrarily, writing of a "1" or respectively of a "0") with a greater granularity, for example a granularity of one page, i.e. the physically defined size of a row of memory cells.

This is because conventional deletion operations are implemented by Fowler-Nordheim effect controlled by a high voltage between the control gate and the semiconductor substrate, usually with a negative potential in the control gate and a positive or zero potential in the substrate. Consequently, conventional deletion potentials are selective only on the group of memory cells that share the same control gate (typically a row).

Thus there is a need to benefit from more compact charge trapping memories, with an advantageous granularity for the two writing operations in programming and in deletion, for example a granularity of one bit, while limiting the number of manufacturing steps in order to reduce production costs.

SUMMARY

According to one aspect, in this regard a non-volatile memory device is proposed, for example produced in an integrated manner in an integrated circuit, including memory cells including a control gate vertically buried in a semiconductor substrate doped with a first type of dopant, for example p-type, and a dielectric interface able to trap electrical charges covering the sides of the control gate facing the semiconductor substrate. Each memory cell furthermore includes a vertical implanted region of a second type of dopant opposite to the first type, for example n-type, located along said sides of the control gate in the semiconductor substrate.

Firstly, the vertical arrangement buried in the substrate of the structure of the control gate and of the dielectric interface greatly reduces the surface area of the substrate occupied by each memory cell.

Secondly, the vertical implanted region in the semiconductor substrate along said sides of the control gate, being doped with the type opposite to the type of the substrate, makes it possible to provide a source of minority charge carriers in the substrate, without creating an inversion channel in the substrate. Consequently, it is possible to benefit, for deletion, from the same selectivity as for programming, advantageously obtained by means of the formation of an inversion channel, while deletion does not give rise to an inversion channel.

According to one embodiment, each memory cell includes a first conduction region doped with the second type of dopant, located in the substrate at a top surface and at one side of the control gate, and a second conduction region doped with the second type of dopant, located in the substrate at depth at the bottom of a trench containing the control gate.

The first conduction region, for example the drain region, makes it possible in particular to selectively access the memory cell individually via a track usually called a bit line; whilst the second conduction region, for example the source region, is advantageously mutualized for the memory cells belonging to one and the same group, for example a row, or even all or a portion of a memory plane.

Furthermore, it will be noted that the first conduction region is located on only one side of the control gate, so that the same control gate structure can be common to two memory cells (each having its drain region on a respective side of the control gate), usually distinguished by the terms "even" and "odd". This is also advantageous in terms of surface footprint.

According to one embodiment, the device furthermore includes writing means configured to generate deletion conditions adapted to an injection of hot charge carriers of a first sign, for example the positive sign, into the dielectric interface, from said vertical implanted region as a source of charge carriers of the first sign.

Thus, in the case where the first type of dopant (i.e. the type of the substrate) is p-type, and the vertical implanted regions located along said sides of the control gate are of n-type, this corresponds to deletion conditions implementing an injection of hot carriers of positive charge, i.e. an injection of hot "holes" (the first sign being the positive sign). And, unlike a deletion by global extraction of trapped charges by Fowler-Nordheim effect implemented between the control gate and the substrate; deletion by injection of hot holes corresponds to a recombination of a negative charge (electrons) contained in a trap with a positive charge (holes) injected into the same trap and coming from said source of positive charge carriers. Thus deletion by injection of hot holes is not global and can be selective by individual memory cells.

According to one embodiment, the writing means are configured to generate the deletion conditions comprising a biasing of the control gate at a potential of a second sign, for example the negative sign, and a biasing of the vertical implanted region at a potential of the first sign, for example the positive sign.

This corresponds to an example of conditions for deletion by injection of hot holes, selective for each memory cell, mentioned above.

According to one embodiment, the writing means are configured to generate the biasing of the vertical implanted region with a non-zero potential of the first sign in the first conduction region and a zero reference potential in the second conduction region, or with a non-zero potential of a first sign in the second conduction region and a zero reference potential in the first conduction region.

This is because, according to the orientation of the tension between the conduction regions, for example from the source to the drain (or respectively from the drain to the source), the electrical field will be the strongest at the pn junction between the drain and the substrate (or respectively at the pn junction between the source and the substrate).

However, impact ionisations, i.e. generations of hot carriers, will occur wherever the electrical field is the strongest, i.e. at one or other of said pn junctions.

Thus it is possible to provide two distinct regions of impact ionisation in one and the same memory cell, and therefore two localities of the dielectric interface for trapping charges by injection of hot carriers. This advantageously makes it possible to be able to independently store two bits per memory cell.

Furthermore, when the same control gate structure is common to two memory cells, a single control gate structure thus makes it possible to access four bits, each of these four bits being accessible selectively and individually in deletion, in programming and in reading.

According to one embodiment, the writing means are furthermore configured to generate programming conditions adapted to an injection of hot charge carriers of the second sign, for example the negative sign, into the dielectric interface, from a channel region formed along said sides of the control gate in the semiconductor substrate as a source of charge carriers of the second sign.

According to one embodiment, the writing means are furthermore configured to generate the programming conditions comprising a biasing of the control gate at a potential of the first sign.

According to one embodiment, the vertical implanted region is doped with a concentration of dopants of the second type of between $5*10^{15}$ at/cm$^3$ and $10^{18}$ at/cm$^3$, the semiconductor substrate being doped with a concentration of dopants of the first type of less than $5*10^{15}$ at/cm$^3$.

And for example the first conduction region can be doped with a concentration of dopants of the second type of between $10^{18}$ at/cm$^3$ and $10^{20}$ at/cm$^3$; the second conduction region can be doped with a concentration of dopants of the second type of between $5*10^{15}$ at/cm$^3$ et $10^{18}$ at/cm$^3$.

According to one embodiment, said buried control gate belongs to a trench extending vertically in the substrate and is superimposed on a selection gate in said trench.

According to another aspect, a method for manufacturing a non-volatile memory device including memory cells is also proposed, the manufacture of each memory cell comprising: a formation of a control gate vertically buried in a semiconductor substrate doped with a first type of dopant; a formation of a dielectric interface able to trap electrical charges covering sides of the control gate facing the semiconductor substrate; and furthermore a formation of a vertical implanted region of a second type of dopant opposite to the first type located along said sides of the control gate in the semiconductor substrate.

According to one embodiment, said manufacture of each memory cell comprises: a formation of a first conduction region doped with the second type of dopant, located in the substrate at a top surface and at one side of the control gate, and a formation of a second conduction region doped with the second type of dopant, located in the substrate at depth at the bottom of a trench containing the control gate.

According to one embodiment, furthermore including writing operations comprising a generation of deletion conditions producing an injection of hot charge carriers of a first sign, for example the positive sign, into the dielectric interface, from said vertical implanted region as a source of charge carriers of the first sign.

According to one embodiment, the writing operations comprise a generation of the deletion conditions comprising a biasing of the control gate at a potential of a second sign, for example the negative sign, and a biasing of the vertical implanted region at a potential of the first sign.

According to one embodiment, the writing operations comprise a generation of the biasing of the vertical implanted region with a non-zero potential of the first sign in the first conduction region and a zero reference potential in the second conduction region, or with a non-zero potential of a first sign in the second conduction region and a zero reference potential in the first conduction region.

According to one embodiment, the writing means furthermore comprise a generation of programming conditions producing an injection of hot charge carriers of the second sign, for example the negative sign, into the dielectric interface, from a channel region formed along said sides of the control gate in the semiconductor substrate as a source of charge carriers of the second sign.

According to one embodiment, the writing operations furthermore comprise a generation of the programming conditions comprising a biasing of the control gate at a potential of the second sign.

According to one embodiment: said formation of the control gate and said formation of the dielectric interface comprise an etching of a trench sinking vertically in the semiconductor substrate; and said formation of the vertical implanted region of the second type of dopant comprises, before the formations of the respective materials of the dielectric interface and of the control gate in the trench: formation of a sacrificial body doped with the second type of dopant filling the trench; diffusion of the dopants of the sacrificial body in the semiconductor substrate along the sides of the trench; removal of the sacrificial body from the trench.

According to one implementation, the vertical implanted region is doped with a concentration of dopants of the second type of between $5*10^{15}$ at/cm$^3$ and $10^{18}$ at/cm$^3$, the semiconductor substrate being doped with a concentration of dopants of the first type of less than $5*10^{15}$ at/cm$^3$.

And for example the first conduction region can be doped with a concentration of dopants of the second type of between $10^{18}$ at/cm$^3$ and $10^{20}$ at/cm$^3$; the second conduction region can be doped with a concentration of dopants of the second type of between $5*10^{15}$ at/cm$^3$ et $10^{18}$ at/cm$^3$.

According to one embodiment, the manufacture of each memory cell furthermore comprises: formation of a selection gate in a trench extending vertically in the semiconductor substrate; said formation of the control gate being done in said trench on top of the selection gate.

BRIEF DESCRIPTION OF THE DRAWINGS

Other advantages and features of the invention will become apparent upon examining the detailed description of non-limiting embodiments and implementations, and from the accompanying drawings, in which figures:

FIG. 1 illustrates the result of etching a trench in a semiconductor substrate doped with the first type of dopant and including a implanted region in accordance with embodiments;

FIG. 2 illustrates the result of forming a "sacrificial" oxide layer on the sides and bottom of the trench in accordance with embodiments;

FIG. 3 illustrates the result of forming a first conductive gate material in accordance with embodiments;

FIG. 4 illustrates the result of removing the first conductive gate material over a height less than the depth of the trench in accordance with embodiments;

FIG. 5 illustrates the result of a first example of forming a vertical implanted region of the second type of dopant in the semiconductor substrate, and located along the sides of the trench in accordance with embodiments;

FIGS. 6A to 6D illustrate a second example of forming a vertical implanted region of the second type of dopant in the semiconductor substrate, along the sides of the trench, wherein FIG. 6A illustrates the result of forming a fine sacrificial oxide layer, on the sides and the bottom of a already formed trench, wherein FIG. 6B illustrates the result of forming a sacrificial body highly doped with the second type of dopant in the already formed trench, wherein FIG. 6C illustrates the result of diffusing dopants, from the sacrificial body to the semiconductor substrate through the fine sacrificial oxide layer, and wherein FIG. 6D illustrates the result after annealing and stabilization of the dopants;

FIG. 7 illustrates the result after the formation of a vertical implanted region located in the semiconductor substrate, along the sides of the trench;

FIG. 8 illustrates the result of forming a first layer of silicon oxide;

FIG. 9 illustrates the result of forming a layer of silicon nitride on the first oxide layer;

FIG. 10 illustrates the result of forming a second layer of silicon oxide on the nitride layer;

FIG. 11 illustrates the result of forming a second conductive gate material;

FIG. 12 illustrates the result of planarization in which all the layers located above the front face of the substrate have been removed;

FIG. 13 illustrates an example of implementation of a non-volatile memory device including memory cells of the "SONOS" type;

FIG. 14 illustrates an example of implementation of a non-volatile memory device including memory cells of the "SONOS" type, as an alternative to the one described in relation to FIG. 13;

FIGS. 15A, 15B and 15C illustrate principles of the writing operations, typically including a programming and/or a deletion, in the example of the memory cell CEL1 described previously in relation to FIG. 13, wherein FIG. 15A illustrates programming conditions producing an injection of hot carriers with a negative charge into charge traps of the dielectric interface, wherein FIG. 15B illustrates "global" deletion conditions producing an extraction of the charges stored in the charge traps of the dielectric interface by Fowler-Nordheim effect, and wherein FIG. 15C illustrates deletion conditions advantageously producing an injection of hot carriers with a positive charge;

FIGS. 16A, 16B, 16C and 16D illustrate the deletion conditions, selective by bit, in the case of the implementation of the memory cells without the selection gate, as described previously in relation to FIG. 14, wherein FIG. 16A illustrates the first deletion conditions for the odd memory cell, wherein FIG. 16B illustrates the second deletion conditions for the odd memory cell, wherein FIG. 16C illustrates the first deletion conditions for the even memory cell, wherein FIG. 16D illustrates the second deletion conditions for the even memory cell; and FIGS. 17A, 17B, 17C and 17D illustrate the programming conditions, selective by bit, in the case of the implementations of the memory cells without the selection gate, as described previously in relation to FIG. 14, wherein FIG. 17A illustrates first programming conditions for the odd memory cell which may for example be identical to the first deletion conditions for the odd memory cell but with a biasing of the control gate with the positive high-voltage potential, wherein FIG. 17B illustrates first programming conditions for the odd memory cell, which may for example be identical to the second deletion conditions for the odd memory cell but with a biasing of the control gate with the positive high-voltage potential, wherein FIG. 17C illustrates first programming conditions for the even memory cell, which may for example be identical to the first deletion conditions for the even memory cell but with a biasing of the control gate with the positive high-voltage potential, and wherein FIG. 17D illustrates second programming conditions for the even memory cell, which may for example be identical to the second deletion conditions for the even memory cell but with a biasing of the control gate with the positive high-voltage potential; and FIG. 18 illustrates, in a first table, the conditions for selectively accessing in reading mode the first bit of the odd memory cell, and, in a second table, the conditions for selectively accessing in reading mode the second bit of the odd memory cell.

DETAILED DESCRIPTION OF ILLUSTRATIVE EMBODIMENTS

FIGS. 1 to 12 illustrate results of steps of a method for manufacturing memory cells of the "SONOS" (the acronym for the usual terms "silicon oxide nitride oxide silicon" well known to a person skilled in the art) charge trapping type as shown by FIGS. 13 and 14.

In this respect, reference is made to FIG. 13.

FIG. 13 illustrates an example of implementation of a non-volatile memory device including memory cells CEL1, CEL2 of the "SONOS" type.

A control gate CG is vertically buried in a semiconductor substrate SUB doped with a first type of dopant, for example p type.

The control gate CG is in this regard advantageously formed in an opening, called a trench, etched vertically in depth in the substrate SUB, from a front face FA of the substrate.

The control gate CG can advantageously be common to two memory cells CEL1, CEL2, usually designated respectively "odd cell" CEL1 and "even cell" CEL2. The two memory cells CEL1, CEL2 are located on either side (horizontally) of the vertical control gate CG.

A dielectric interface ITFD able to trap electrical charges covers the sides of the control gate CG facing the semiconductor substrate SUB.

A dielectric interface ITFD is in this regard advantageously formed in said trench containing the control gate CG, before the formation of the control gate CG, so as to envelop the control gate CG on the sides FL1, FL2 and the bottom of the control gate CG.

For example, the dielectric interface ITFD includes a succession of layers of silicon oxide O, of silicon nitride N, and of silicon oxide O. In summary, the layer of silicon nitride N is able to store the electrical charges in "charge traps" while the layers of oxide O have an electrical insulation functionality of the gate oxide type.

Each memory cell CEL1, CEL2 furthermore includes a vertical implanted region AdVt of a second type of dopant opposite to the first type, i.e. n type in this example, located in the semiconductor substrate SUB, along the sides FL1, FL2 of the control gate CG and thus along the dielectric interface ITFD.

In absolute terms, since each of the memory cells CEL1, CEL2 is located alongside a respective side of the control gate CG, the vertical implanted region AdVt of the respective memory cells CEL1, CEL2 is located in the substrate SUB along the respective side FL1, FL2, and along the respective dielectric interface ITFD.

Moreover, the memory cells CEL1, CEL2 each include a first conduction region D1, D2 doped with the second type of dopant (n type in this example), for example the drain region, located in the substrate SUB at a top interface of the substrate, i.e. the front face FA, and on the respective side of the control gate CG.

The front face FA of the substrate SUB corresponds to the surface on which metal contacts CNT are coupled, connecting elements of the semiconductor substrate (D1, CG, D2), with metal tracks of an interconnection grating (not shown, conventional and known per se).

Moreover, the memory cells CEL1, CEL2 each include a second conduction region S-NISO doped with the second type of dopant (n type in this example), for example the source region, located in the substrate SUB in depth at the bottom FD of the trench containing the control gate CG.

For example, the second conduction region S-NISO belongs to a "source plane", i.e. a region implanted in depth in the substrate, of the isolation well ("NISO") type of a structure of the triple well type.

Furthermore, in this example, the memory cells CEL1, CEL2 include a selection gate SG, also in the trench containing the control gate CG, between the control gate CG and the bottom FD of the trench.

The selection gate SG is electrically isolated from the substrate SUB and from the source region S-NISO by a dielectric gate envelope Dsg. The selection gate SG is also isolated from the control gate by a dielectric layer.

For example, in practice: the semiconductor substrate SUB, typically made from silicon, can be doped with boron at a concentration of between $10^{14}$ and $5*10^{15}$ at/cm$^3$; the first conduction regions D1, D2 can be doped with arsenic at a concentration of between $10^{18}$ and $10^{20}$ at/cm$^3$; the second conduction region S-NISO can be doped with phosphorus at a concentration of between $5*10^{15}$ and $10^{18}$ at/cm$^3$ the vertical implanted regions AdVt can be doped with phosphorus (or arsenic) at a concentration of between $5*10^{15}$ and $10^{18}$ at/cm$^3$.

FIG. 14 illustrates an example of implementation of a non-volatile memory device including memory cells CEL1, CEL2 of the "SONOS" type, as an alternative to the one described in relation to FIG. 13.

In this alternative, the memory cells CEL1, CEL2 do not include the selection gate SG, or the corresponding dielectric gate envelope Dsg.

The other elements of the device and of the memory cells CEL1, CEL2 support the same references, and the entire remainder of the description given in relation to FIG. 13 applies to the alternative in FIG. 14.

Reference is now made to FIGS. 1 to 12.

FIG. 1 illustrates the result of a step 100 of etching the trench TR in the semiconductor substrate SUB, doped with the first type of dopant, i.e. for example p type, and including the n-type doped region S-NISO implanted in depth in the substrate SUB.

FIG. 2 illustrates the result of a step 200 of forming a "sacrificial" oxide layer SACOX, on the sides and bottom of the trench TR. The sacrificial oxide layer SACOX will nevertheless form the gate oxide Dsg (FIG. 13) of the future selection gate SG (FIG. 3 et seq). For example, the sacrificial layer SACOX can have a thickness of between 5 nm and 10 nm.

FIG. 3 illustrates the result of a step 300 of forming a first conductive gate material Po, for example made from doped polycrystalline silicon. The first gate material Po is deposited in excess so as to fill the trench and also overflow above the front face FA.

FIG. 4 illustrates the result of an etching step 400 removing the first gate material Po over a height less than the depth of the trench TR, for example a height of between 50% and 90% of the depth of the trench. For example, the etching 400 is implemented for a period parameterised in this regard according to the etching speed. Furthermore, the etching 400 is configured to be selective with respect to the silicon oxide, so as not to etch, or to etch very little, the sacrificial oxide layer SACOX in order to protect the substrate SUB against this etching 400.

FIG. 5 illustrates the result of a first example of a step 500 of forming a vertical implanted region AdVt of the second type of dopant, i.e. n type, in the semiconductor substrate SUB, and located along the sides FLTr1, FLTr2 of the trench TR.

In this first example, this vertical orientation of the implanted region AdVt can be obtained by implementing a first inclined implantation TLTIMP1 so as to obliquely expose a first side of the trench FLTr1 and a second inclined implantation TLTIMP2 so as to obliquely expose a second side of the trench FLTr2.

FIGS. 6A to 6D illustrate a preferential second example of forming a vertical implanted region AdVt of the second type of dopant, i.e. n type, in the semiconductor substrate SUB, along the sides FLTr1, FLTr2 of the trench TR.

This is because it may be difficult to implement a uniform channel implantation, vertically along the lateral walls of the trench, in particular according to the shape factor, using inclined implantation techniques. The second example described advantageously makes it possible to form the vertical implanted region AdVt uniform around the vertical trenches.

FIG. 6A illustrates the result of a step 610 of forming a fine sacrificial oxide layer SACOX_Thn, on the sides FLTr, FLTr and the bottom of a trench TRd already formed.

In particular, the fine sacrificial oxide layer SACOX_Thn is finer than the sacrificial oxide layer SACOX described previously in relation to FIG. 2. For example, the fine sacrificial oxide layer SACOX_Thn has a thickness of less than 5 nm. In particular, the fine sacrificial oxide layer SACOX_Thn is not intended to form a dielectric gate region, and does not have the constraint of a minimum thickness in this regard.

In an embodiment corresponding to the example of FIG. 13, the trench TRd already formed can correspond to the trench TR in FIG. 4, in which the sacrificial oxide layer SACOX is removed wherever it is not covered by the first gate material Po.

In an embodiment corresponding to the example of FIG. 14, the trench TRd already formed can correspond to the trench TR in FIG. 1.

FIG. 6B illustrates the result of a step 620 of forming a sacrificial body highly doped with the second type of dopant SACPOLYN+, i.e. n type, in the trench already formed TRd. For example, the sacrificial body SACPOLYN+ is formed with a conductive gate material, such as polycrystalline silicon, and for example in the manner described previously in relation to FIG. 3.

FIG. 6C illustrates the result of a step 630 of diffusing n-type dopants, from the sacrificial body SACPOLYN+ to the semiconductor substrate SUB through the fine sacrificial oxide layer SACOX_Thn.

At the end of the diffusion 630, the profile of the n-type doping, i.e. the spatial variation of the concentration of dopants in the substrate SUB, can have a "droplet" form caused by the acute shape of the trench.

FIG. 6D illustrates the result of a step 640 in which annealings and stabilisation of the dopants have been implemented, so that the profile of the n-type doping obtained by the diffusion of step 630 is made uniform along the sides FLTr of the trench TRd.

Furthermore, step 640 comprises a removal of the sacrificial body, for example in accordance with the same type of etching as described previously in relation to FIG. 4.

FIG. 7 illustrates the result of a step 700, after the formation 500, 610-640 of the n-type vertical implanted region AdVt located in the semiconductor substrate SUB, along the sides FLTr1, FLTr2 of the trench TR, i.e. along the sides of the future control gate CG and along the future charge-trapping dielectric interface ITFD.

The step 700 corresponds to the removal of the sacrificial oxide layer SACOX wherever it is not covered by the first gate material Po, in an embodiment corresponding to the example in FIG. 13 (after the formation 500 described in relation to FIG. 5); or to the removal of the fine sacrificial oxide layer SACOX_Thn, optionally in an embodiment corresponding to the example in FIG. 14 (after the formation 610-640 described in relation to FIGS. 6A to 6D).

FIG. 8 illustrates the result of a step 800 of forming a first layer of silicon oxide O, for example by means of a standard deposition, i.e. a deposition with a uniform and constant thickness of the layer O, whatever the orientation (vertical or horizontal) of the deposition surface.

FIG. 9 illustrates the result of a step 900 of forming a layer of silicon nitride N, in a standard manner on the first oxide layer O.

FIG. 10 illustrates the result of a step 1000 of forming a second layer of silicon oxide O, in a standard manner on the nitride layer N.

For example, each of the layers of oxide nitride of the stack ONO can have a thickness of between 5 nm and 10 nm.

At the end of steps 800, 900, 1000 described in relation to FIGS. 8, 9 and 10, a dielectric interface ITFD has been formed able to trap electrical charges, in particular in "charge traps" of the layer of silicon nitride N. The dielectric interface is intended to cover the sides of the future control gate CG facing the semiconductor substrate SUB.

FIG. 11 illustrates the result of a step 1100 of forming a second conductive gate material P2, for example made from doped polycrystalline silicon.

The second gate material P2 is deposited in excess so as to fill the trench TR, i.e. the volume remaining inside the trench TR between the sides and the bottom of the stack of dielectric layers ONO of the interface ITFD, and to overflow onto the stack of dielectric layers ONO, above the front face FA.

FIG. 12 illustrates the result of a step 1200 of planarisation in which all the layers located above the front face FA of the substrate SUB have been removed.

This type of removal 1200 is for example implemented by a chemical-mechanical planarisation technique "CMP".

In this way the vertical buried control gate structure CG has been formed, with the second gate material P2, in the substrate SUB, as described previously in relation to FIG. 13 or 14; and, with the first gate material Po, the selection gate structure SG has been formed, as described previously in relation to FIG. 13.

Thus, after steps 1300 of implantation of the drain regions D1, D2, of formation of the metal contacts CNT and of the remainder of the integrated circuit manufacturing chain, the memory device described previously in relation to FIG. 13 in the case of the presence of the selection gate SG, or to FIG. 14 in the case of absence of the selection gate SG, has been obtained.

Moreover, it should be noted that each selection gate SG can be common to a group of even and odd memory cells CEL1, CEL2, usually referred to as a "page", typically a line of the physical organisation of a memory plane containing all the memory cells, and including subsets called "words". The words may for example include one or more bytes, and have a control gate CG common to the even and odd memory cells CEL1, CEL2 belonging to one and the same word.

FIGS. 15A, 15B and 15C illustrate principles of the writing operations, typically including a programming and/or a deletion, in the example of the memory cell CEL1 described previously in relation to FIG. 13.

In the remainder of the present description, it is considered by convention that a programming of a memory cell corresponds to the writing of the data item "o" (according to an arbitrary example of a convention), while a deletion of a memory cell corresponds to the writing of the data item "1" (according to the same example). It is also considered by convention that programming is obtained by trapping a charge having the negative sign, i.e. electrons; and that deletion is obtained by expelling trapped negative charges, or advantageously by injecting charges with a positive sign, i.e. holes, recombining with trapped negative charges.

Also by convention, and consistently with the example given above in relation to FIGS. 1 to 14 according to which the first type of dopant is p type while the second type of dopant is n type, it is considered that the positive sign of the charges and potentials (in volts) is the "first sign", while the negative sign of the charges and of the potentials (in volts) is the "second sign".

FIG. 15A illustrates programming conditions PRHT producing an injection of hot carriers with a negative charge, i.e. "hot electrons" HTe-, in charge traps of the dielectric interface ITFD.

The programming conditions PRHT comprise a biasing of the control gate CG at a positive high-voltage potential, for example substantially +9 V (volts), so that the hot electrons HTe- can come from a channel region CNL formed along the sides of the control gate CG in the semiconductor substrate. The channel region CNL thus forms the source of the hot negative-charge carriers.

Furthermore, the programming conditions PRHT can comprise a biasing of the drain D1 of the selected memory cell CEL1 at a moderate positive potential, for example substantially +4.5 V; an application of an activation potential in the selection gate SG able to cause continuity of the channel region CNL along the selection gate SG as far as the source S-NISO, example of substantially 1.5 V; a biasing of the source S-NISO and of the substrate SUB at a zero reference voltage 0 V; as well as leaving floating the potential in the drains D2 of all the other memory cells CEL2, as well as a blocking potential, for example 0 V, in the non-selected selection gates.

FIG. 15B illustrates "global" deletion conditions ERFD producing an extraction of the charges stored in the charge traps of the dielectric interface ITFD by Fowler-Nordheim effect.

These global deletion conditions ERFD comprise a biasing of the control gate CG at a so-called shared negative high-voltage potential, for example substantially −10 V, and a biasing of the substrate SUB at a moderate positive tension, also shared, for example of substantially +5 V, so that the trapped electrons are expelled from the traps of the nitride layer N to the substrate SUB.

Moreover, the conditions of global deletion by Fowler-Nordheim effect ERFD can furthermore comprise a biasing of the drains D1, D2 of the selection gate SG and of the source S-NISO of all the memory cells in the deleted (selected) row at the shared positive potential of substantially 5 V.

The conditions of the Fowler-Nordheim effect being obtained between the control gate CG and the substrate SUB, all the even and odd memory cells CEL1, CEL2 belonging to one and the same row are deleted by these conditions ERFD. This is disadvantageous in itself.

FIG. 15C illustrates preferential deletion conditions ERFD advantageously producing an injection of hot carriers with a positive charge, i.e. "hot holes" HTh+, in charge traps of the dielectric interface ITFD recombining with negative charges trapped in said traps.

The preferential deletion conditions ERHT have the advantage of being selective by bit, i.e. each bit of each memory cell CEL1 can be deleted selectively with respect to the other bits of the memory cells CEL2 in the same row or same memory word.

This is because the preferential deletion conditions ERHT comprise a biasing of the control gate CG at a negative high-voltage potential, for example substantially-9 V (volts). This strong negative potential of the control gate CG blocks the formation of a channel region CNL in the substrate SUB. However, despite the absence of the channel region CNL (and therefore of the source of charge carriers such as for the programming PRHT), a high current can circulate in the implanted vertical regions AdVt, provided that there is a sufficiently high drain potential D1. The high positive drain potential D1 causes a creation of hot holes HTh+ by impact ionisation. The current circulating in the vertical implanted region AdVt of the odd cell CEL1 thus forms the source of the hot positive charge carriers HTh+.

Furthermore, the preferential deletion conditions ERHT are selective by bit since they comprise a biasing of the drain D1 of the selected memory cell CEL1 at a moderately high positive potential, for example substantially +4.5 V.

Moreover, the preferential conditions of selective deletion by bits ERHT comprise an application of an activation potential in the selection gate SG, able to generate a channel region forming an electrical continuity between the vertical implanted region AdVt and the source S-NISO, along the selection gate SG, for example of substantially 2.5 V; a biasing of the source S-NISO and of the substrate SUB at a zero reference voltage 0 V; as well as leaving floating the potential in the drains D2 of all the other memory cells CEL2. The non-selected selection gates can be taken to a blocking potential, for example 0 V.

FIGS. 16A, 16B, 16C and 16D illustrate the preferential deletion conditions ERHT, selective by bit, in the case of the implementation of the memory cells without the selection gate SG, as described previously in relation to FIG. 14.

FIGS. 16A to 16D furthermore illustrate another advantageous capability of the preferential deletion conditions ERHT, allowing a storage of two independent bits in one and the same odd memory cell CEL1 or even memory cell CEL2.

This is because it is possible in this regard to generate: first deletion conditions ERHT_1_up for the odd memory cell CEL1 (FIG. 16A), first deletion conditions ERHT_2_up for the even memory cell CEL2 (FIG. 16C), second deletion conditions ERHT_1_dwn for the odd memory cell CEL1 (FIG. 16B), second deletion conditions ERHT_2_dwn for the even memory cell CEL2 (FIG. 16D).

FIG. 16A illustrates the first deletion conditions ERHT_1_up for the odd memory cell CEL1, biasing the vertical implanted region AdVt with the non-zero positive potential, for example 4.5 V, in the first conduction region D1 and the zero reference potential 0 V in the second conduction region S-NISO.

Furthermore, the negative high voltage, for example −9 V, is applied in the control gate CG, and the first conduction region D2 of the even memory cell CEL2 sharing the same control gate CG is left at a floating potential at high impedance Hz.

FIG. 16B illustrates the second deletion conditions ERHT_1_dwn for the odd memory cell CEL1, biasing the vertical implanted region AdVt with the zero positive potential, 0 V, in the first conduction region D1 and the non-zero reference potential, for example 4.5 V, in the second conduction region S-NISO.

Furthermore, the negative high voltage, for example −9 V, is applied in the control gate CG, and the first conduction region D2 of the even memory cell CEL2 sharing the same control gate CG is left at a floating potential at high impedance Hz.

FIG. 16C illustrates the first deletion conditions ERHT_2_up for the even memory cell CEL2, biasing the vertical implanted region AdVt with the non-zero positive potential, for example 4.5 V, in the first conduction region D2 and the zero reference potential, 0 V, in the second conduction region S-NISO.

Furthermore, the negative high voltage, for example −9 V, is applied in the control gate CG, and the first conduction region D1 of the odd memory cell CEL1 sharing the same control gate CG is left at a floating potential at high impedance Hz.

FIG. 16D illustrates the second deletion conditions ERHT_2_dwn for the even memory cell CEL2, biasing the vertical implanted region AdVt with the zero positive potential, 0 V, in the first conduction region D2 and the non-zero reference potential, for example 4.5 V, in the second conduction region S-NISO.

Furthermore, the negative high voltage, for example −9 V, is applied in the control gate CG, and the first conduction region D1 of the odd memory cell CEL1 sharing the same control gate CG is left at a floating potential at high impedance Hz.

This is because, according to the orientation of the voltage between the conduction regions, for example from the source to the drain in the case of the first deletion conditions ERHT_1_up, ERHT_2_up, the electrical field will be the strongest at the pn junction between the drain D1, D2 and the substrate SUB.

And, respectively in the orientation of the voltage between the conduction regions from the drain to the source in the case of the second deletion conditions ERHT_1_dwn, ERHT_2_dwn, the electrical field will be the strongest at the pn junction between the source S-NISO and the substrate SUB.

However, the impact ionisations IMPCT_1_up, IMPCT_1_dwn, IMPCT_2_up, IMPCT_2_dwn, the i.e. generations of hot carriers, will occur wherever the electrical field is the strongest, i.e. at one or other of said pn junctions.

Thus it is possible to provide two distinct impact ionisation regions IMPCT_1_up, IMPCT_1_dwn in one of the same odd memory cell CEL1, and respectively two distinct impact ionisation regions IMPCT_2_up, IMPCT_2_dwn in one and the same even memory cell CEL2.

Each odd memory cell CEL1 or even memory cell CEL2 therefore includes two localities of the dielectric interface ITFD for trapping charges by injecting hot holes. This advantageously makes it possible to be able to independently store two bits per memory cell.

FIGS. 17A, 17B, 17C and 17D illustrate the preferential programming conditions PRHT, selective by bit, in the case of the implementations of the memory cells without the selection gate SG, as described previously in relation to FIG. 14.

The programming conditions have the same advantageous capability of storing two independent bits in one and the same odd memory cell CEL1 or even memory cell CEL2.

In this respect, reference will be made to:

FIG. 17A, which illustrates first programming conditions PRHT_1_up for the odd memory cell CEL1 which may for example be identical to the first deletion conditions ERHT_1_up for the odd memory cell CEL1 but with a biasing of the control gate CG with the positive high-voltage potential, for example +10 V.

FIG. 17B, which illustrates first programming conditions PRHT_1_up for the odd memory cell CEL1, which may for example be identical to the second deletion conditions ERHT_1_dwn for the odd memory cell CEL1 but with a biasing of the control gate CG with the positive high-voltage potential, for example +10 V;

FIG. 17C, which illustrates first programming conditions PRHT_2_up for the even memory cell CEL2, which may for example be identical to the first deletion conditions ERHT_2_up for the even memory cell CEL2 but with a biasing of the control gate CG with the positive high-voltage potential, for example +10 V;

FIG. 17D, which illustrates second programming conditions PRHT_2_dwn for the even memory cell CEL2, which may for example be identical to the second deletion conditions ERHT_2_dwn for the even memory cell CEL2 but with a biasing of the control gate CG with the positive high-voltage potential, for example +10 V.

The selectivity and location mechanisms IMPCT_1_up, IMPCT_1_dwn, IMPCT_2_up, IMPCT_2_dwn of the two bits per odd cell CEL1 and even cell CEL2 are the same in programming PRHT_1_up, PRHT_1_dwn, PRHT_2_up, PRHT_2_dwn as described previously in relation to FIGS. 16A-16D for deletion ERHT_1_up, ERHT_1_dwn, ERHT_2_up, ERHT_2_dwn.

FIG. 18 illustrates firstly, in a table RD_1_up, the conditions for selectively accessing in reading mode the first bit (IMPCT_1_up) of the odd memory cell CEL1, and secondly, in a table RD_1_dwn, the conditions for selectively accessing in reading mode the second bit (IMPCT_1_dwn) of the odd memory cell CEL1.

The conditions for accessing in reading mode the two bits of the even memory cell CEL2 are obtained by reversing the biasings between the drain regions D1 and D2 of the tables RD_1_up and RD_1_dwn.

Moreover, writing means ME of conventional design and not shown are provided for implementing the writing operations ERHT, ERFD, PRTH, ERHT_1_up, ERHT_1_dwn, ERHT_2_up, ERHT-2-dwn, PRTH_1_up, PRTH_1_dwn, PRTH-2-up, PRTH_2_up, and reading operations RD_1_dwn, RD_1_up as described above in relation to FIGS. 15A to 18, and can for example include a high-voltage generator of the charge pump type, logic for transmitting high-voltages to the memory cells, and logic of the state machine type for timing and controlling the writing and reading operations.

In summary, a non-volatile memory of the charge trapping type has been described, in which a single vertical control gate structure CG, optionally superimposed on a selection gate SG in a trench, and therefore having a very small surface footprint on the front face FA of the substrate SUB, makes it possible to access 4 bits, each of these four bits being selectively and individually accessible in deletion, in programming and in reading.

What is claimed is:

1. A non-volatile memory device comprising:
   memory cells including
      a control gate vertically buried in a semiconductor substrate doped with a first type of dopant,
      a dielectric interface able to trap electrical charges covering sides of the control gate facing the semiconductor substrate, and
      a vertical implanted region of a second type of dopant opposite to the first type located along the sides of the control gate in the semiconductor substrate.

2. The device according to claim 1, wherein each memory cell includes a first conduction region doped with the second type of dopant, located in the substrate at a top surface and at one side of the control gate, and a second conduction region doped with the second type of dopant, located in the substrate at a depth at the bottom of a trench containing the control gate.

3. The device according to claim 1, wherein the vertical implanted region is doped with a concentration of dopants of the second type of between $5 \times 10^{15}$ at/cm$^3$ and $10^{18}$ at/cm$^3$, the semiconductor substrate being doped with a concentration of dopants of the first type of less than $5 \times 10^{15}$ at/cm$^3$.

4. The device according to claim 1, wherein the control gate belongs to a trench extending vertically in the substrate and is superimposed on a selection gate in the trench.

5. A non-volatile memory device comprising:
   memory cells including
      a control gate vertically buried in a semiconductor substrate doped with a first type of dopant,
      a dielectric interface able to trap electrical charges covering sides of the control gate facing the semiconductor substrate, and

a vertical implanted region of a second type of dopant opposite to the first type located along the sides of the control gate in the semiconductor substrate; and a writing circuit configured to generate deletion conditions adapted to an injection of hot charge carriers of a first sign into the dielectric interface, from the vertical implanted region as a source of charge carriers of the first sign.

6. The device according to claim 5, wherein each memory cell includes a first conduction region doped with the second type of dopant, located in the substrate at a top surface and at one side of the control gate, and a second conduction region doped with the second type of dopant, located in the substrate at a depth at the bottom of a trench containing the control gate.

7. The device according to claim 5, wherein the writing circuit is configured to generate the deletion conditions comprising a biasing of the control gate at a potential of a second sign and a biasing of the vertical implanted region at a potential of the first sign.

8. The device according to claim 7, wherein each memory cell includes a first conduction region doped with the second type of dopant, located in the substrate at a top surface and at one side of the control gate, and a second conduction region doped with the second type of dopant, located in the substrate at a depth at the bottom of a trench containing the control gate, and wherein the writing circuit is configured to generate the biasing of the vertical implanted region with a non-zero potential of the first sign in the first conduction region and a zero reference potential in the second conduction region, or with a non-zero potential of a first sign in the second conduction region and a zero reference potential in the first conduction region.

9. The device according to claim 7, wherein the writing circuit is configured to generate programming conditions adapted to an injection of hot charge carriers of the second sign into the dielectric interface, from a channel region formed along the sides of the control gate in the semiconductor substrate as a source of charge carriers of the second sign.

10. The device according to claim 9, wherein each memory cell includes a first conduction region doped with the second type of dopant, located in the substrate at a top surface and at one side of the control gate, and a second conduction region doped with the second type of dopant, located in the substrate at a depth at the bottom of a trench containing the control gate, and wherein the writing circuit is configured to generate the programming conditions comprising a biasing of the control gate at a potential of the second sign.

11. A method for manufacturing a non-volatile memory device including memory cells, the manufacture of each memory cell comprising:

a formation of a control gate vertically buried in a semiconductor substrate doped with a first type of dopant;

a formation of a dielectric interface able to trap electrical charges covering sides of the control gate facing the semiconductor substrate; and furthermore a formation of a vertical implanted region of a second type of dopant opposite to the first type located along the sides of the control gate in the semiconductor substrate.

12. The method according to claim 11, wherein the manufacture of each memory cell comprises:

16 a formation of a first conduction region doped with the second type of dopant, located in the substrate at a top surface and at one side of the control gate, and a formation of a second conduction region doped with the second type of dopant, located in the substrate at a depth at the bottom of a trench containing the control gate.

13. The method according to claim 12, furthermore including writing operations comprising a generation of deletion conditions producing an injection of hot charge carriers of a first sign into the dielectric interface, from the vertical implanted region as a source of charge carriers of the first sign.

14. The method according to claim 13, wherein the writing operations comprise a generation of the deletion conditions comprising a biasing of the control gate at a potential of a second sign and a biasing of the vertical implanted region at a potential of the first sign.

15. The method according to claim 14, wherein the writing operations comprise a generation of the biasing of the vertical implanted region with a non-zero potential of the first sign in the first conduction region and a zero reference potential in the second conduction region, or with a non-zero potential of a first sign in the second conduction region and a zero reference potential in the first conduction region.

16. The method according to claim 14, wherein the writing operations furthermore comprise a generation of programming conditions producing an injection of hot charge carriers of the second sign into the dielectric interface, from a channel region formed along the sides of the control gate in the semiconductor substrate as a source of charge carriers of the second sign.

17. The method according to claim 16, wherein the writing operations furthermore comprise a generation of the programming conditions comprising a biasing of the control gate at a potential of the second sign.

18. The method according to claim 11, wherein:

the formation of the control gate and the formation of the dielectric interface comprise an etching of a trench sinking vertically in the semiconductor substrate; and the formation of the vertical implanted region of the second type of dopant comprise, before the formations of the respective materials of the dielectric interface and of the control gate in the trench:

formation of a sacrificial body doped with the second type of dopant filling the trench;

diffusion of the dopants of the sacrificial body in the semiconductor substrate along the sides of the trench; and removal of the sacrificial body from the trench.

19. The method according to claim 11, wherein the vertical implanted region is doped with a concentration of dopants of the second type of between $5\times10^{15}$ at/cm$^3$ and $10^{18}$ at/cm$^3$, the semiconductor substrate being doped with a concentration of dopants of the first type of less than $5\times10^{15}$ at/cm$^3$.

20. The method according to claim 11, wherein the manufacture of each memory cell furthermore comprises:

formation of a selection gate in a trench extending vertically in the semiconductor substrate; and the formations of the control gate being done in the trench on top of the selection gate.

* * * * *